United States Patent
Godet et al.

(10) Patent No.: US 8,969,181 B2
(45) Date of Patent: Mar. 3, 2015

(54) METHOD FOR EPITAXIAL LAYER OVERGROWTH

(75) Inventors: Ludovic Godet, Boston, MA (US); Morgan D. Evans, Manchester, MA (US); Christopher R. Hatem, Hampton, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 194 days.

(21) Appl. No.: 13/440,616

(22) Filed: Apr. 5, 2012

(65) Prior Publication Data
US 2012/0258583 A1  Oct. 11, 2012

Related U.S. Application Data

(60) Provisional application No. 61/473,984, filed on Apr. 11, 2011.

(51) Int. Cl.
*H01L 21/205* (2006.01)
*H01L 21/02* (2006.01)
*H01L 21/265* (2006.01)
*H01L 21/266* (2006.01)

(52) U.S. Cl.
CPC .... *H01L 21/02658* (2013.01); *H01L 21/02381* (2013.01); *H01L 21/0254* (2013.01); *H01L 21/02639* (2013.01); *H01L 21/02647* (2013.01); *H01L 21/26506* (2013.01); *H01L 21/26586* (2013.01); *H01L 21/266* (2013.01)
USPC ............................ 438/480; 438/481; 438/506

(58) Field of Classification Search
USPC .................. 438/480, 481, 506; 257/E21.132
See application file for complete search history.

(56) References Cited

U.S. PATENT DOCUMENTS

| | | | | |
|---|---|---|---|---|
| 3,855,009 | A * | 12/1974 | Lloyd et al. | 438/480 |
| 5,334,864 | A * | 8/1994 | Tokunaga et al. | 257/78 |
| 5,425,808 | A * | 6/1995 | Tokunaga et al. | 117/95 |
| 6,429,466 | B2 * | 8/2002 | Chen et al. | 257/183 |
| 7,341,929 | B2 * | 3/2008 | Tseng et al. | 438/506 |
| 7,767,977 | B1 | 8/2010 | Godet et al. | |
| 2001/0046754 | A1 * | 11/2001 | Takasu | 438/440 |
| 2006/0172501 | A1 * | 8/2006 | Ueno et al. | 438/300 |
| 2006/0286779 | A1 * | 12/2006 | Booth et al. | 438/480 |
| 2010/0065865 | A1 * | 3/2010 | Byun et al. | 257/94 |
| 2010/0323508 | A1 | 12/2010 | Adibi et al. | |

FOREIGN PATENT DOCUMENTS

JP      01065834 A * 3/1989 ............ H01L 21/205

OTHER PUBLICATIONS

K. Hiramatsu, Epitaxial Lateral Overgrowth Techniques Used in Group III Nitride Epitaxy, J. of Phys.: Condensed Matter, 2001, pp. 6961-6975, vol. 13, Inst. of Phys. Publ'g.

(Continued)

*Primary Examiner* — George Fourson, III

(57) ABSTRACT

Oxygen, silicon, germanium, carbon, or nitrogen is selectively implanted into a workpiece. The workpiece is annealed to incorporate the ions into the workpiece. A compound semiconductor is then formed on the workpiece. For example, gallium nitride may be formed on a silicon, silicon carbide, or sapphire workpiece. The width of the implanted regions can be configured to compensate for any shrinkage during annealing.

20 Claims, 4 Drawing Sheets

(56) References Cited

OTHER PUBLICATIONS

Oliver et al., Scanning Capacitance Microscopy Studies of GaN Grown by Epitaxial Layer Overgrowth, J. of Phys.: Conf. Series, 16th Int'l Conf. on Microscopy of Semiconducting Materials, 2010, pp. 1-4 vol. 209, Inst. of Phys. Publ'g.

Kim et al., Epitaxial Lateral Overgrowth of GaN on Si (111) Substrates Using High-Dose, N+ Ion Implantation, Chem. Vap. Deposition, 2010, pp. 80-84, vol. 16, Wiley.

Kim, Bumjoon, et al. Expitaxial Lateral Overgrowth of GaN Using High-dose N+-ion-implantation, ECS Transactions, 2010, vol. 25, Issue 33, pp. 169-174.

Sasaki, T., et al., Surface smoothing effect in patterened SOI fabrication with SIMOX Technology, 2003 IEEE International SOI Conference Proceedings, Jan. 1, 2003, pp. 48-49, IEEE, Piscataway, New Jersey, USA.

* cited by examiner

METHOD FOR EPITAXIAL LAYER OVERGROWTH

CROSS-REFERENCE TO RELATED APPLICATIONS

This claims priority to the provisional patent application entitled "Method for Epitaxial Layer Overgrowth," filed Apr. 11, 2011 and assigned U.S. App. No. 61/473,984, the disclosure of which is hereby incorporated by reference.

FIELD

This invention relates to epitaxial layer overgrowth (ELOG) and, more particularly, to ELOG using ion implantation.

BACKGROUND

Ion implantation is a standard technique for introducing conductivity-altering impurities into a workpiece. A desired impurity material is ionized in an ion source, the ions are accelerated to form an ion beam of prescribed energy, and the ion beam is directed at the surface of the workpiece. The energetic ions in the beam penetrate into the bulk of the workpiece material and are embedded into the crystalline lattice of the workpiece material to form a region of desired conductivity.

In order for light-emitting diodes (LEDs) to gain more of the lighting market, improvements in efficiency and manufacturing cost may be required. LEDs, laser diodes, or other devices may be fabricated on compound semiconductors, such as GaN. One method of improving the efficiency of compound semiconductor devices is ELOG. ELOG uses a periodic mask structure to block the growth of GaN in some areas. Then some GaN will grow more laterally when it joins neighboring areas. This may result in a higher quality solid layer of GaN. Previous methods used a photoresist (PR) mask to block a portion of the implanted ions, but this adds cost and complexity. Accordingly, there is a need in the art for improved methods of ELOG.

SUMMARY

According to a first aspect of the invention, a method of workpiece processing is provided. The method comprises selectively implanting ions into a plurality of implanted regions in a workpiece. The ions comprise oxygen, silicon, germanium, carbon, or nitrogen. The workpiece is annealed such that the ions are incorporated into the implanted regions. A compound semiconductor is formed on the workpiece.

According to a second aspect of the invention, a method of workpiece processing is provided. The method comprises determining a width of an implanted region to compensate for shrinkage of the width during annealing. Oxygen ions are selectively implanted into a plurality of the implanted regions in a workpiece. Each of the implanted regions has a box profile beginning at a surface of the workpiece and has the width. The workpiece comprises silicon. The workpiece is annealed to form silicon oxide on the implanted regions. A compound semiconductor is formed on the workpiece.

According to a third aspect of the invention, a method of workpiece processing is provided. The method comprises determining a width of an implanted region to compensate for shrinkage of the width during annealing. Nitrogen ions are selectively implanted into a plurality of implanted regions in a workpiece. Each of the implanted regions has a box profile beginning at a surface of the workpiece and has the width. The workpiece comprises silicon. The workpiece is annealed to form silicon nitride on the implanted regions. A compound semiconductor is formed on the workpiece.

BRIEF DESCRIPTION OF THE DRAWINGS

For a better understanding of the present disclosure, reference is made to the accompanying drawings, which are incorporated herein by reference and in which.

DETAILED DESCRIPTION

The embodiments are described herein in connection with formation of a compound semiconductor such as GaN, but these embodiments also may be used with other III/V compound semiconductors, compound semiconductors, or other materials known to a person skilled in the art. While one specific type of implanter is disclosed, other ion implantation systems known to those skilled in the art that can focus an ion beam or that can implant particular regions of a workpiece without a mask on the workpiece may be used in the embodiments described herein. For example, this may involve a stencil or shadow mask disposed a distance from the workpiece in an alternate embodiment. Beamline implanters, plasma doping implanters, flood implanters, or focused ion beam implanters may be used. Thus, the invention is not limited to the specific embodiments described below.

Figure 1:
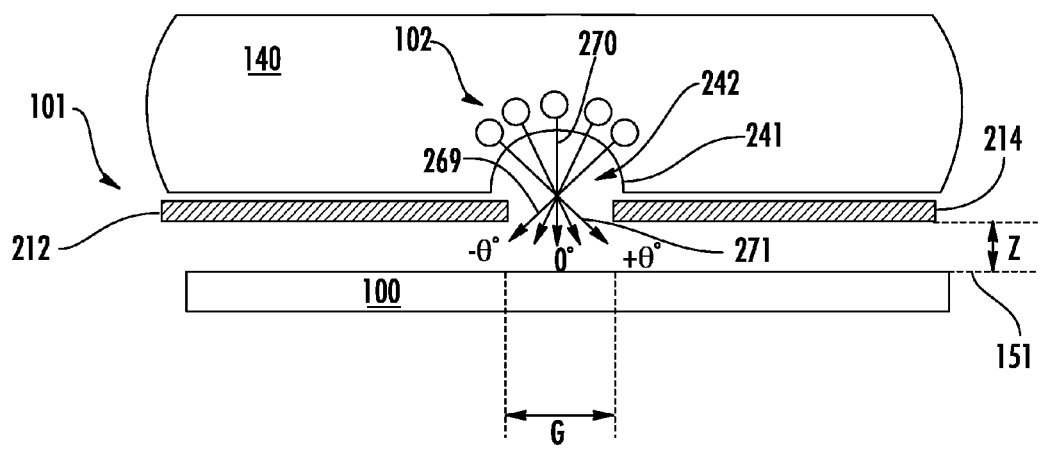
FIG. 1 is a block diagram of a plasma processing apparatus having a plasma sheath modifier.

FIG. 1 is a block diagram of a plasma processing apparatus. The plasma 140 is generated as is known in the art. This plasma 140 is generally a quasi-neutral collection of ions and electrons. The ions typically have a positive charge while the electrons have a negative charge. The plasma 140 may have an electric field of, for example, approximately 0 V/cm in the bulk of the plasma 140. In a system containing the plasma 140, ions 102 from the plasma 140 are attracted toward a workpiece 100. These ions 102 may be attracted with sufficient energy to be implanted into the workpiece 100. The plasma 140 is bounded by a region proximate the workpiece 100 referred to as a plasma sheath 242. The plasma sheath 242 is a region that has fewer electrons than the plasma 140. Hence, the differences between the negative and positive charges cause a sheath potential in the plasma sheath 242. The light emission from this plasma sheath 242 is less intense than the plasma 140 because fewer electrons are present and, hence, fewer excitation-relaxation collisions occur. Thus, the plasma sheath 242 is sometimes referred to as "dark space."

The sheath modifier 101 is configured to modify an electric field within the plasma sheath 242 to control a shape of a boundary 241 between the plasma 140 and the plasma sheath 242. Accordingly, ions 102 that are attracted from the plasma 140 across the plasma sheath 242 may strike the workpiece 100 at a large range of incident angles. This sheath modifier 101 also may be referred to as, for example, a focusing plate or sheath engineering plate and may be a semiconductor, insulator, or conductor.

In the embodiment of FIG. 1, the sheath modifier 101 includes a pair of panels 212 and 214 defining an aperture therebetween having a horizontal spacing (G). In other embodiments, the sheath modifier 101 may include only one panel or more than two panels. The panels 212 and 214 may be a pair of sheets having a thin, flat shape. In other embodiments, the panels 212 and 214 may be other shapes such as tube-shaped, wedge-shaped, and/or have a beveled edge proximate the aperture. The panels 212 and 214 also may be positioned a vertical spacing (Z) above the plane 151 defined by the front surface of the workpiece 100. In one embodiment, the vertical spacing (Z) may be about 1.0 to 10.0 mm.

Ions 102 may be attracted from the plasma 140 across the plasma sheath 242 by different mechanisms. In one instance, the workpiece 100 is biased to attract ions 102 from the plasma 140 across the plasma sheath 242. In another instance, a plasma source that generates the plasma 140 and walls surrounding the plasma 140 are biased positively and the workpiece 100 may be grounded. The biasing may be pulsed in one particular embodiment. In yet another instance, electric or magnetic fields are used to attract ions 102 from the plasma 140 toward the workpiece 100.

Advantageously, the sheath modifier 101 modifies the electric field within the plasma sheath 242 to control a shape of the boundary 241 between the plasma 140 and the plasma sheath 242. The boundary 241 between the plasma 140 and the plasma sheath 242 may have a convex shape relative to the plane 151 or another shape not parallel to the plane 151. When the workpiece 100 is biased, for example, the ions 102 are attracted across the plasma sheath 242 through the aperture between the panels 212 and 214 at a large range of incident angles. For instance, ions 102 following trajectory path 271 may strike the workpiece 100 at an angle of +θ° relative to the plane 151. Ions 102 following trajectory path 270 may strike the workpiece 100 at about an angle of 0° relative to the same plane 151. Ions 102 following trajectory path 269 may strike the workpiece 100 an angle of −θ° relative to the plane 151. Accordingly, the range of incident angles may be between +θ° and −θ° centered about 0°. In addition, some ion trajectories paths such as paths 269 and 271 may cross each other. Depending on a number of factors including, but not limited to, the horizontal spacing (G) between the panels 212 and 214, the vertical spacing (Z) of the panels 212 and 214 above the plane 151, the dielectric constant of the panels 212 and 214, or other process parameters of the plasma 140, the range of incident angles (θ) may be between +60° and −60° centered about 0°, though other ranges of θ are possible. In another embodiment, the panels 212 and 214 may each have different vertical spacing (Z) relative to the workpiece 100, which may allow the ions 102 to primarily follow trajectories at an angle relative to the plane 151.

Figure 2A:
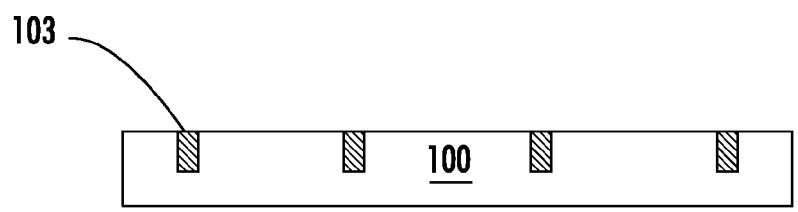
FIGS. 2A-2C are cross-sectional side views of a first embodiment of FLOG using implantation.
Figure 2B:
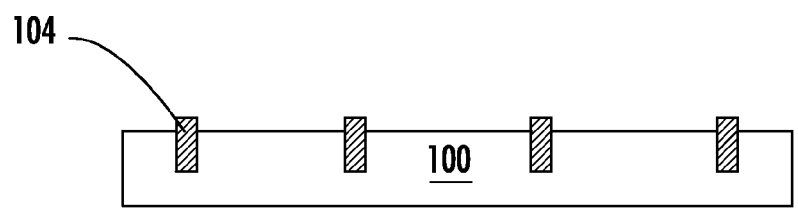
Figure 2C:
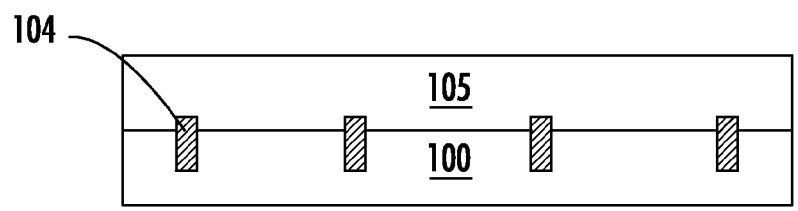

In one embodiment, the process disclosed herein is used to grow GaN on a workpiece. FIGS. 2A-2C are cross-sectional side views of a first embodiment of ELOG using implantation. In FIG. 2A, the workpiece 100, which may be silicon, sapphire, or another material, is selectively implanted with oxygen to form implanted regions 103. Four implanted regions 103 are illustrated in FIG. 2A, but more or fewer are possible. Each implanted region 103 may be between, for example, a few μm to a few mm in dimension and may be a line across the surface of the workpiece 100. The implanted regions 103 may be formed using the plasma sheath modifier 101 of FIG. 1 in one instance. The workpiece 100 or plasma sheath modifier 101 may be translated or scanned to form the multiple implanted regions 103. The biasing may be timed with this translation or scanning to form the implanted regions 103. The embodiment illustrated in FIG. 2A does not require a mask on the surface of the workpiece 100 to form the implanted regions 103.

In one particular embodiment, the implanted regions 103 have a box profile beginning at the surface of the workpiece 100. Thus, the implanted regions 103 may have a surface peak. The implanted regions 103 may be doped to a depth of greater than approximately 100 nm in one instance. In an alternate embodiment, the implanted regions 103 have a curved profile.

In FIG. 2B, the workpiece 100 is annealed. This incorporates the implanted species into the workpiece. $SiO_2$ regions 104 are created using some or all of the implanted regions 103. These $SiO_2$ regions 104 are then used for FLOG. Then in FIG. 2C a GaN layer 105 is formed on the workpiece 100 using ELOG. The GaN layer 105 may not grow in a blanket pattern. Instead, the GaN layer 105 may begin growing between the $SiO_2$ regions 104 and eventually grow together over the $SiO_2$ regions 104. This growth pattern may decrease the number of dislocations that occur within the GaN layer 105. The use of ELOG will result: in a GaN layer 105 of higher quality.

In an alternate embodiment, the workpiece 100 is sapphire or SiC and silicon is implanted to form the implanted regions 103. During an anneal in an oxygen atmosphere the $SiO_2$ regions 104 are formed. A GaN layer 105 is then formed on the workpiece 100 using ELOG.

In yet another alternate embodiment, nitrogen is used to form the implanted regions 103 in a workpiece 100. SiN regions are formed during the anneal instead of $SiO_2$ regions 104. A GaN layer 105 is then formed on the workpiece 100 using ELOG.

Germanium also may be used to form the implanted regions 103 in the workpiece 100. SiGe regions are formed during the anneal instead of $SiO_2$ regions 104. A GaN layer 105 is then formed on the workpiece 100 using ELOG. The presence of SiGe may cause some strain in the workpiece 100, which may benefit the growth of the GaN layer 105 during ELOG. For example, the GaN layer 105 may grow above the implanted regions 103 at a different rate than the non-implanted regions.

Carbon also may be used to form the implanted regions 103 in the workpiece 100. Amorphous regions containing carbon are formed during implantation or anneal instead of the of $SiO_2$ regions 104. A GaN layer 105 is then formed on the workpiece 100 using ELOG. The carbon or crystal structure of the implanted regions 103 may prevent or reduce growth of the GaN layer 105 over the implanted regions 103. These implanted regions 103 may not shrink during an anneal.

In another embodiment, a mixture of ions may be implanted into the workpiece. For example, nitrogen and oxygen may be used to form the implanted regions 103. Other combinations of species disclosed herein or combinations of species disclosed herein with other species are possible.

Figure 3:
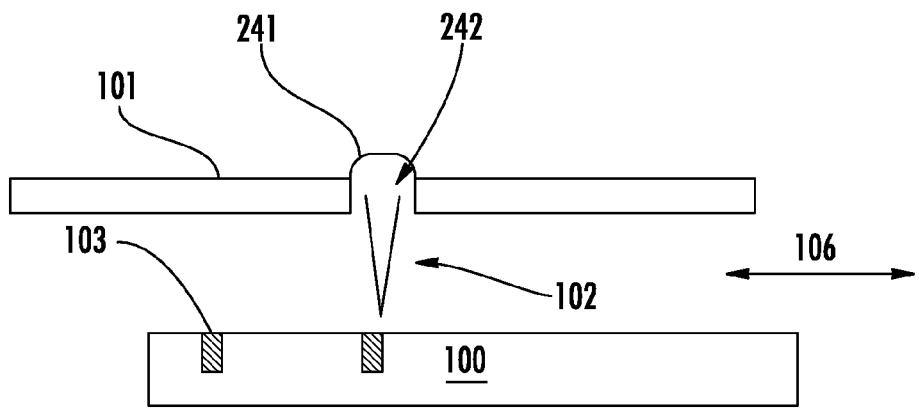
FIG. 3 is a side view of an embodiment of selective ion implantation.

FIG. 3 is a side view of an embodiment of selective ion implantation. Implanted regions 103 are formed in the workpiece 100 using the ions 102. The workpiece 100 is scanned with respect to the sheath modifier 101 or ions 102, as illustrated by the arrow 106. This may involve moving the sheath modifier 101, workpiece 100, or both. The scanning may be in one dimension or two dimensions. In one particular embodiment, the workpiece 100 is biased when the ions 102 implant the implanted regions 103. The bias scheme is adjusted to produce the desired pattern of implanted regions 103. Thus, the workpiece 100 is not biased when the ions 102 would implant between the implanted regions 103. This eliminates or reduces ions 102 from impacting between the implanted regions 103. In this manner, the implanted regions 103 may be formed without a mask or photoresist layer on the workpiece 100. Alignment, lithography, or photoresist removal steps may be eliminated.

The location of the implanted regions 103 may be carefully controlled because spacing of the implanted regions 103 may affect growth of the GaN layer 105 during ELOG. This spacing may be Optimized for the best GaN layer 105 growth.

The dose rate and focus of the ions 102 can be varied to form the implanted regions 103. If the workpiece 100 is scanned, then the ions 102 may be switched on and off to form the implanted regions 103, the dose of the ion 102 may be adjusted to reduce implantation between the implanted regions 103, or the ions 102 may be focused when implanting the implanted regions 103. If the ions 102 are focused when implanting the implanted regions 103, the ions 102 may be less focused over other parts of the workpiece 100, which reduces implantation between the implanted regions 103.

Figure 4:
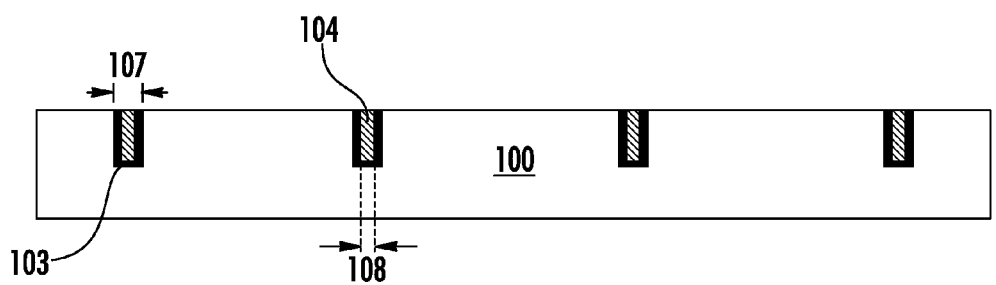
FIG. 4 is a cross-sectional side view illustrating shrinkage of the implanted areas.

FIG. 4 is a cross-sectional side view illustrating shrinkage of the implanted areas. Here, the implanted regions 103 are illustrated as shaded black with a width 107. The $SiO_2$ regions 104 are illustrated in cross-hatch with a width 108, though this also may be used for SiN regions or for other species disclosed herein. The width 108 is less than the width 107. This is due to the annealing step, which leads to shrinkage. For example, some of the oxygen (or nitrogen) may diffuse from the workpiece 100 during the anneal. In one particular embodiment, a width 107 of an implanted region 103 is determined in order to compensate for shrinkage of the width 107 during annealing to the width 108. Thus, the width 108 is configured to the desired dimension for ELOG during growth of the GaN layer. In one instance, the width 108 is approximately 30% to 70% less than the width 107 and the width 107 is configured to be larger to compensate for this shrinkage. In one instance, a width 107 of 10 µm shrank to a width 108 3 µm during anneal.

The anneal conditions also may be varied to improve the later FLOG step. These anneal conditions affect the sharpness of the implanted regions 103.

In another alternate embodiment, the implanted regions 103 are doped after formation or after anneal. This may change the conductivity of the implanted regions 103. In another instance, the implanted regions 103 are subsequently doped with silicon after an anneal. For example, silicon may be implanted into the $SiO_2$ of the implanted regions 103 to improve ELOG. In another example, an ion species such as germanium is implanted into the implanted regions 103 to cause stress in the lattice of the workpiece 100.

The implants disclosed herein may be performed into a heated workpiece 100. This workpiece 100 may be at a temperature elevated above room temperature, such as up to about 400° C. or other elevated temperatures. This may affect the incorporation of ion species into the workpiece 100 or affect the required anneal.

The embodiments disclosed herein can be applied to other compound semiconductors besides GaN, such as other II-VI or III-V compound semiconductors. Other workpiece materials, ions, or annealing environments also may be used. This technique enables a higher quality thin film. Patterned or textured workpieces also can be used, which was difficult using previous methods. An angular distribution of ions may be used to treat all the sidewalls of the patterned or textured workpiece. In another instance, multiple implants at different angles may be used to treat all the sidewalls of the patterned or textured workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. These other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A method of workpiece processing comprising:
   selectively implanting ions into a plurality of implanted regions in a workpiece, wherein said ions comprise oxygen, silicon, germanium, carbon, or nitrogen;
   annealing said workpiece such that said ions are incorporated into said implanted regions; and
   forming a compound semiconductor on said workpiece, wherein said compound semiconductor grows over said implanted regions.

2. The method of claim 1, wherein said workpiece is silicon and said ions comprise oxygen or nitrogen.

3. The method of claim 1, wherein said workpiece is one of sapphire or silicon carbide and said ions comprise silicon.

4. The method of claim 1, wherein said compound semiconductor is one of a II-VI semiconductor or a III-V semiconductor.

5. The method of claim 1, wherein said selectively implanting comprises scanning said workpiece with respect to said ions and increasing a bias to said workpiece to form said implanted regions.

6. The method of claim 1, wherein said workpiece has a non-planar surface.

7. The method of claim 1, wherein said ions are implanted in a box profile beginning at a surface of said workpiece.

8. The method of claim 1, wherein each of said implanted regions has a width and further comprising determining said width to compensate for shrinkage of said width during said annealing.

9. A method of workpiece processing comprising:
   determining a width of an implanted region to compensate for shrinkage of said width during annealing;
   selectively implanting oxygen ions into a plurality of said implanted regions in a workpiece, each of said implanted regions having a box profile beginning at a surface of said workpiece and each of said implanted regions having said width, said workpiece comprising silicon;
   annealing said workpiece to form silicon oxide on said implanted regions; and
   forming a compound semiconductor on said workpiece.

10. The method of claim 9, wherein said selectively implanting comprises scanning said workpiece with respect to said oxygen ions and increasing a bias to said workpiece to form said implanted regions.

11. The method of claim 9, wherein said compound semiconductor is one of a II-VI semiconductor or a III-V semiconductor.

12. The method of claim 11, wherein said compound semiconductor is GaN.

13. The method of claim 9, wherein said workpiece has a non-planar surface.

14. A method of workpiece processing comprising:
determining a width of an implanted region to compensate for shrinkage of said width during annealing;
selectively implanting nitrogen ions into a plurality of implanted regions in a workpiece, each of said implanted regions having a box profile beginning at a surface of said workpiece and each of said implanted regions having said width, said workpiece comprising silicon;
annealing said workpiece to form silicon nitride on said implanted regions; and
forming a compound semiconductor on said workpiece.

15. The method of claim 14, wherein said selectively implanting comprises scanning said workpiece with respect to said nitrogen ions and increasing a bias to said workpiece to form said implanted regions.

16. The method of claim 14, wherein said compound semiconductor is one of a II-VI semiconductor or a III-V semiconductor.

17. The method of claim 14, wherein said compound semiconductor is GaN.

18. The method of claim 14, wherein said workpiece has a non-planar surface.

19. The method of claim 3, wherein said annealing is performed in an oxygen atmosphere to form silicon oxide on said implanted regions.

20. The method of claim 1, wherein said selectively implanting comprises:
increasing a bias to said workpiece to attract ions through an aperture in a sheath modifier to form an implanted region;
translating said workpiece relative to said sheath modifier; and
repeating said increasing and translating a plurality of times to form said plurality of implanted regions.

* * * * *